United States Patent [19]

Pastor et al.

[11] 4,190,640

[45] Feb. 26, 1980

[54] GENERATION OF NASCENT BROMINE FOR USE IN THE GROWTH OF ULTRA PURE METAL BROMIDES

[75] Inventors: Ricardo C. Pastor, Manhattan Beach; Antonio C. Pastor, Santa Monica, both of Calif.

[73] Assignee: Hughes Aircraft Company, Culver City, Calif.

[21] Appl. No.: 965,802

[22] Filed: Dec. 4, 1978

[51] Int. Cl.² .............................................. C01B 7/10
[52] U.S. Cl. ................................... 423/500; 423/386; 156/616 R; 156/DIG. 71
[58] Field of Search ............... 423/500, 386, 501, 502; 156/616 R, DIG. 71

[56] References Cited

U.S. PATENT DOCUMENTS

| 1,267,638 | 5/1918 | Datta | 423/502 |
|---|---|---|---|
| 3,959,442 | 5/1976 | Pastor et al. | 423/263 |
| 3,969,491 | 7/1976 | Pastor et al. | 423/449 |
| 4,076,574 | 2/1978 | Pastor et al. | 156/616 R |
| 4,128,589 | 12/1978 | Pastor et al. | 260/563 |

OTHER PUBLICATIONS

Pastor et al., "Crystal Growth in a Reactive Atmosphere", Materials Research Bulletin, Pergamon Press, Inc., vol. 10, 1975, pp. 117–124.

Pastor et al., "Crystal Growth of KBr in a Reactive Atmosphere", Materials Research Bulletin, Pergamon Press, Inc., vol. 10, 1975, pp. 261–266.

*Primary Examiner*—Earl C. Thomas
*Attorney, Agent, or Firm*—B. T. Hogan, Jr.; W. H. MacAllister

[57] ABSTRACT

An improved process for generating nascent bromine through the pyrolytic dissociation of $CBr_4$ is shown to be applicable to the growth of large single crystals of metal bromides from the melt.

4 Claims, No Drawings

GENERATION OF NASCENT BROMINE FOR USE IN THE GROWTH OF ULTRA PURE METAL BROMIDES

RELATED APPLICATIONS

U.S. application Ser. No. 743,264, filed Nov. 19, 1976, by Applicant A. C. Pastor herein, for "Crystal Growth of Metal Halides and Chalcogenides for Infrared Window Applications" discloses a reactive atmosphere process for forming large single metal halide and chalcogenide crystals.

U.S. application Ser. No. 808,844 filed June 22, 1977, by Applicant R. C. Pastor herein et al, which issued as U.S. Pat. No. 4,128,589 for "Generation of $CF_4$ From Teflon for Reactive Atmosphere Processing and Growth of Metal Fluorides" discloses a process for generating $CF_4$ and nascent fluorine.

U.S. application Ser. No. 879,551, filed Feb. 2, 1978, as a continuation of U.S. application Ser. No. 645,151, (now abandoned) by Applicants herein for "A Reactive-Atmosphere-Processing Method of Crystal Growth of Alkaline Earth Chlorides" discloses a process for growing ultra pure alkaline earth chloride crystals under a reactive atmosphere comprised of a nascent halogen.

Each of the applications listed above are commonly assigned to Hughes Aircraft Company and are the outgrowth of a company research program.

BACKGROUND OF THE INVENTION

1. Field of the Invention

This invention deals generally with the use of $CBr_4$ as a reactive atmosphere processing (RAP) agent for the growth of metal bromides and more particularly to the generation of nascent Br during the pyrolytic dissociation of $CBr_4$.

2. Description of the Prior Art

The closest known prior art related to the use of carbon tetrabromide in the growth of metal halide crystals is contained in an article entitled "Crystal Growth of KBr in a Reactive Atmosphere" published in the Materials Research Bulletin, Vol. 10, pp. 261–266, (1975) of the Pergamon Press by Applicants herein and M. A. Aaronson where the problem solved by the present invention is identified.

Applicants also defined the problem solved by this invention in "Crystal Growth in a Reactive Atmosphere" published at pp. 117–124 of the Materials Research Bulletin, Vol. 10, referred to above.

Applicants herein further discussed the problem associated with the pyrolysis of $CBr_4$ in their U.S. Pat. No. 4,076,574, issued Feb. 28, 1978.

In each of the above-identified processes, the use of $CBr_4$ as a nascent halogen source in a RAP crystal growth process is taught to be precluded by the nature of the dissociation path taken above certain temperatures when $CBr_4$ is utilized as a source of nascent bromine. It was shown that for congruent growth of KBr from the melt the desired dissociation path

$$CBr_4 \rightarrow CBr_3 + Br \quad (1)$$

gives way to the competing path:

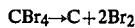

$$CBr_4 \rightarrow C + 2Br_2 \quad (2)$$

which yields undesirable results during crystal growth processes.

Ultra pure large single crystals of alkali metal bromides and alkaline earth metal bromides may be produced by crystal growth from the melt processes which utilize a reactive atmosphere comprised of nascent bromine. Nascent bromine has been found to be a substantially superior gettering agent for anion impurities than other gettering agents such as molecular bromine.

SUMMARY OF THE INVENTION

The general purpose of this invention is to provide a reliable process for generating nascent bromine from $CBr_4$ and $CHBr_3$ under KBr crystal growth from the melt conditions, i.e., at temperatures in excess of 600° C.

In seeking to achieve the above-stated purpose and at the same time avoid the disadvantages of the prior art, a pyrolytic decay process has been invented wherein nascent bromine is generated by causing $CBr_4$ and other carbonaceous bromides to dissociate at temperatures greater than 600° C. in a particular manner.

The process entails the provision of a reactive carrier gas comprised of a mixture of an inert gas such as nitrogen, argon or helium and nitric or nitrous oxide in the bromide pyrolysis chamber as the bromide is subjected to temperatures in excess of 600° C.

We discovered that the net effect of the presence of NO or $NO_2$ in the pyrolysis chamber during the dissociation of $CBr_4$ is an oxidation reaction which favors the production of nascent Br. Additionally, it was discovered that NOBr, a product of the reaction which takes place, lowers the ratio of $P(H_2O)/P(HBr)$, called the RAP index, which favors the production of ultra pure large single crystals of KBr.

Accordingly is an object of this invention to: provide a process for generating nascent bromine from $CBr_4$ and $CHBr_3$; to provide a process for generating nascent bromine from $CBr_4$ at temperatures greater than 600° C.; to provide a process for generating nascent bromine from $CBr_4$ that is reproducible and predictable; and to provide nascent bromine in a predictable, reproducible manner for use in the congruent growth of KBr single crystals from the melt utilizing the RAP crystal growth process.

The achievement of these objectives and other features of this invention will become more fully apparent in the following description of the invention.

DETAILED DESCRIPTION OF THE INVENTION

It has been shown that ultra pure large single crystals of alkali metal and alkaline earth metal halides can be grown from the congruent melt by providing a reactive atmosphere of a nascent halogen during the crystal growth process. In our U.S. Pat. No. 4,076,574, whose teachings are incorporated herein by reference, we taught the production of nascent Br by subjecting $CH_2Br_2$ and $CF_3Br$ to pyrolysis temperatures equivalent to the melting point of KBr and showed that these materials were suitable as sources of nascent Br during congruent crystal growth processes whereas $CBr_4$ and $CHBr_3$ were not suitable as sources of nascent Br during crystal growth from a congruent melt.

Our subsequent studies have shown that the production of nascent Br from $CBr_4$ and $CHB_3$ at the melting points of monovalent metal bromides, bivalent metal bromides and trivalent metal bromides can be achieved in a predictable reproducible manner. Basically the process requires the provision of an agent which favors the production of nascent bromine and removes elemental carbon from the dissociation products.

At temperatures greater than 600° C., the oxidation of carbon (C) by NO or $NO_2$ occurs very readily as shown in the following equations:

$$C + NO \rightarrow CO + (\tfrac{1}{2})N_2 \quad (3)$$

$$C + NO_2 \rightarrow CO + NO, \text{ etc.} \quad (4)$$

The molecular halogen, generated when $CBr_4$ or $CHBr_4$ is subjected to dissociation temperatures in excess of 600° C., reacts with NO to form nitrosyl bromide and nascent bromine in accordance with the following equation:

$$NO + Br_2 \rightarrow NOBr + Br \quad (5)$$

The nitrosyl halide regenerates NO by dissociation as well as elemental Br.

$$NOBr \rightarrow NO + Br \quad (6)$$

The net effect of Equations (5) and (6) is to introduce a cycle which is equivalent to:

$$Br_2 \rightarrow 2Br \quad (7)$$

and aids in boosting up the concentration of nascent Br. Thus, over molten KBr at 780° to 800° C., an effluent gas analysis shows: (a) $0.49 \times 10^{-7}$ mol $Br_2 cm^{-3}$ with $CBr_4$ at 32° C. and the flow=0.71 $cm^3 sec^{-1}$; and (b) $2.1 \times 10^{-7}$ mol $Br_2 cm^{-3}$ with $CBr_4$ at 64° C. and the flow=0.54 $cm^3 sec^{-1}$.

These effluent concentrations are ten times more than that achieved in the prior work (Material Research Bulletin, Vol. 10, p. 117 (1975)) and indicate a higher concentration of Br, the RAP species, over the melt.

In addition to the effects of Equation (5), it was discovered that NOBr lowers $P(H_2O)/P(HBr)$, the RAP index, as shown in Equation (8).

$$NOBr + H_2O \rightarrow HBr + HNO_2 \quad (8)$$

Combining Equations (6) and (8), with the former characterized by $\gamma$ and the latter by $1-\gamma$, we obtain $$NOBr + (1-\gamma)H_2O \rightarrow \gamma NO + (\gamma/2)Br_2 + (1-\gamma)HBr + (1-\gamma)HNO_2 \quad (9)$$

Assuming that the fate of bromine in $CBr_4$ is either as $Br_2$ or HBr in the effluent, as shown in Equation (9), we can calculate:

$$[Br_2]/[HBr] = \gamma/2(1-\gamma) \quad (10)$$

In this manner it can be estimated that case (a) shown above corresponds to $\gamma = 47\%$ and for case (b), $\gamma = 26\%$. But, if one throttles the flow of the carrier gas mixture, i.e. lengthens the residence time of the dissociation elements in the pyrolysis chamber, as in the case of $CBr_4$ at 40° C. and the flow=0.088 $cm^3 sec^{-1}$, $\gamma = 100\%$. We are assured that $Br_2$ resulting from Equation (2) is converted to NOBr by Equation (5), since the NO concentration is at least ten times larger than that of $CBr_4$. The value of $\gamma$ shows that Equation (6) occurs appreciably, indicating the presence of large concentrations of atomic Br, the useful RAP species.

The applicability of $CBr_4/(He,NO)$ to a wide operating temperature range allows one to employ the recipe for the RAP growth of a variety of metal bromides. The following list is an example of materials which can be grown by the above recipe; the number within the parentheses stands for the melting point in ° C. of the metal bromide:

1. Monovalent Metal Bromides: LiBr, (547); NaBr, (755); KBr(730); RbBr(682); CsBr(636); TlBr(480); etc.
2. Bivalent Metal Bromides: $MgBr_2$(700) $CaBr_2$(730); $SrBr_2$(643); $CdBr_2$(567); $BaBr_2$(847) $PbBr_2$(373); etc.
3. Trivalent Metal Bromides: $LaBr_3$(783); $YBr_3$(904); $YbBr_3$(956); etc.

A typical illustration is given by KBr. Repeated runs with this material using $CBr_4$ in a carrier gas consisting of 10 mol % NO in He yield no carbon deposit at all. The resulting KBr crystals show that a good RAP action was provided. The crystals did not stick to the silica crucible.

In practice, the reactive carrier gas is prepared in a gas proportioner at room temperature. We have utilized as little as 10–20% NO or $NO_2$ to 90–80% He. However, we feel as though as little as 1% NO or $NO_2$ would be equally effective. Other inert gases such as nitrogen ($N_2$) and argon (Ar) may be used instead of He. The lower limit of reactive gas species has been limited in our work by an inability to measurably control low flow rates of NO or $NO_2$.

Once the carrier gas is mixed, it is passed over the bromine source species to entrain its vapor. The amount of $CBr_4$ or $CHBr_3$ contained in the carrier gas is a function of the temperature of the bromine source and the flow rate of the carrier gas.

When the bromine source species is $CBr_4$, the best results are obtained by raising the temperature of $CBr_4$ to $75 + 10°$ C. to increase the vapor pressure of the material as the carrier gas in passed through the source chamber.

An apparatus suitable for this process is shown in FIG. 1 on pages 117–124 of Applicants' publication presented in the Materials Research Bulletin, Vol. 10, entitled "Crystal Growth In A Reactive Atmosphere" incorporated herein by reference. The process of this invention differs from that taught on p. 120 of the reference in that the carrier gas is no longer inert He gas and the gas entering the quartz pyrolysis chamber is a mixture of $He + NO$ or $He + NO_2$ with $CBr_4$ rather than $He + CBr_4$. with $CBr_4$ rather than $He + CBr_4$.

While we have shown that nascent Br may be produced from other carbonaceous bromides at temperatures above 600° C. without a reactive carrier gas, we have found that the use of a reactive carrier gas substantially increases the efficiency of these processes.

When one considers that this distinction leads to the production of predictable amounts of nascent bromine in a controllable manner at temperatures above 600° C. whereas the pyrolysis of $CBr_4$ in an inert carrier gas such as He did not, the scope of our claims may now be understood as follows:

What is claimed is:

1. A process for the generation of nascent bromine at temperatures above 600° C. comprising the steps of first providing a reactive carrier gas comprised of an inert gas selected from the group consisting of $N_2$, He and Ar, and a reactive gas comprised of NO, or $NO_2$, passing said carrier gas over a nascent bromine source compound selected from a group consisting of $CBr_4$, $CHBr_3$ and $CH_2Br_2$ whereby the vapors of said bromine source compound are entrained in and mixed with said carrier gas, and passing said carrier gas containing said entrained bromine vapors into a pyrolysis chamber set to a preselected temperature greater than 600° C. whereby said bromine source compound will dissociate into nascent Br.

2. The process of claim 1 wherein said source compound is $CBr_4$ and said inert gas is He.

3. The process of claim 2 wherein said reactive gas is NO.

4. An improved process for generating nascent bromine from carbonaceous bromide source compounds comprising the steps of:
  (a) providing a reactive carrier gas comprised of a mixture of inert carrier gas and compounds selected from the group consisting of NO and $NO_2$,
  (b) mixing said carrier gas with vapors of said bromide source compounds selected from the group consisting of $CBr_4$, $CHBr_3$ and $CH_2Br_2$, and
  (c) passing said mixture of bromide vapors and carrier gas into a pyrolysis chamber heated to a preselected temperature where said reactive carrier gas components will react with the dissociation products of said bromide to favor the production of said nascent Br.

* * * * *